United States Patent [19]

Sado

[11] 4,295,700
[45] Oct. 20, 1981

[54] INTERCONNECTORS

[75] Inventor: Ryoichi Sado, Saitama, Japan

[73] Assignee: Shin-Etsu Polymer Co., Ltd., Tokyo, Japan

[21] Appl. No.: 82,719

[22] Filed: Oct. 9, 1979

[30] Foreign Application Priority Data

Oct. 12, 1978 [JP] Japan .................. 53-140085

[51] Int. Cl.$^3$ .............................................. H01R 9/09
[52] U.S. Cl. .............................. 339/61 M; 339/17 M; 339/DIG. 3
[58] Field of Search .............. 339/17 F, 17 CF, 17 M, 339/17 LM, 59 M, 61 M, DIG. 3

[56] References Cited

U.S. PATENT DOCUMENTS

| | | | |
|---|---|---|---|
| 3,218,585 | 11/1965 | May | 339/17 M |
| 3,960,424 | 6/1976 | Weisenburger | 339/17 M |
| 4,008,938 | 2/1977 | Anhalt et al. | 339/17 LM |
| 4,201,435 | 5/1980 | Nakamura et al. | 339/DIG. 3 |

*Primary Examiner*—Neil Abrams
*Attorney, Agent, or Firm*—Toren, McGeady & Stanger

[57] ABSTRACT

A novel press-contact type interconnector is proposed which is formed by comprising (a) a rectangular connecting piece made of a film or sheet of an elastic material having anisotropical electroconductivity in the direction substantially parallel to one edge line thereof and (b) a couple of holder members made of an electrically insulating material holding said rectangular connecting piece as sandwiched therebetween in such a manner that the two opposite peripheral portions of the rectangular piece along the edge lines perpendicular to the direction of the anisotropical electroconductivity are each extended out of the surfaces of the holder members in the direction forming an angle between 10° and 80° with said surface of the holder member by a height not smaller than the thickness of the rectangular connecting piece. The above described inventive interconnector is advantageous in the reliability of the electric connection without any special supporting means even when the printed circuit boards or display units to be connected with the interconnector are of a relatively large size where otherwise considerably large contacting pressure is required.

2 Claims, 16 Drawing Figures

FIG_1
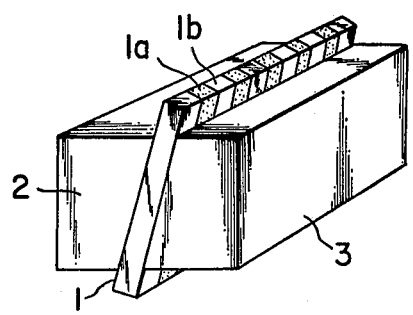
FIG_2
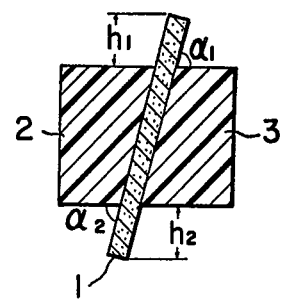
FIG_3
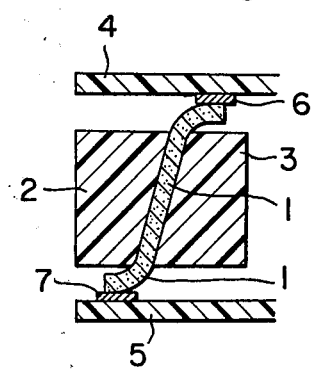
FIG_4
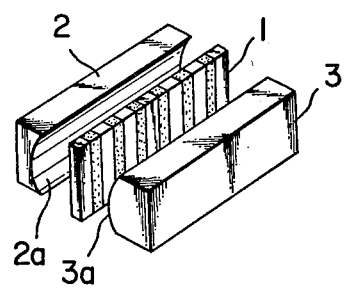
FIG_5
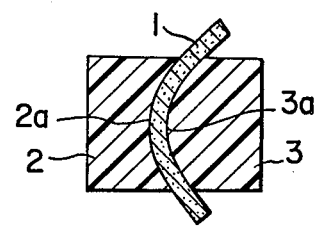

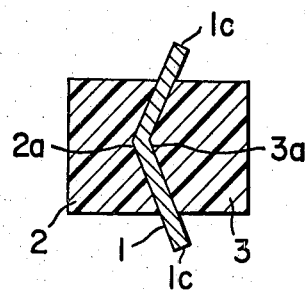
FIG_6
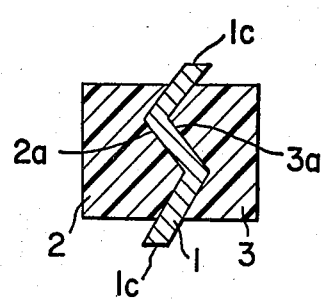
FIG_7
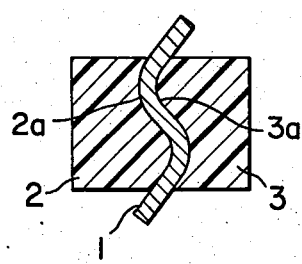
FIG_8
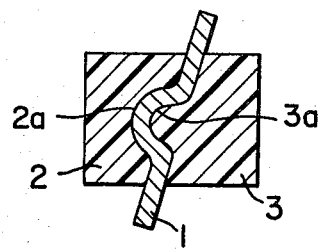
FIG_9
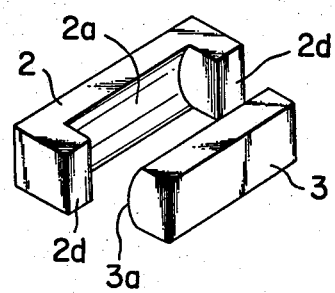
FIG_10
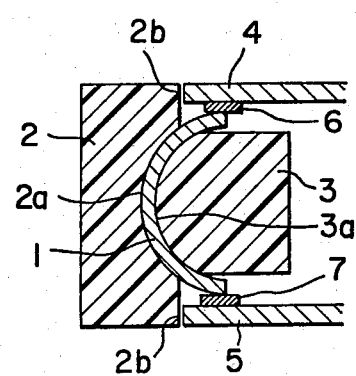
FIG_11 alternate assembly of portions of electroconductive elastic material 1a (black portions) and portions of electrically insulating elastic material 1b (white portions) to form black-and-white stripes so that the rectangular piece has, as a whole, an electroconductivity only in the direction parallel to each of the stripes, i.e. in the up and down direction in the figures but insulating in the direction perpendicular to each of the stripes.

The material of this rectangular connecting piece 1 must have an adequate elasticity or flexibility so as to be bent with elastic resilience but is not limited to specific materials. Suitable materials are, for example, flexible synthetic resins and rubbery elastomers and rigid synthetic resins may also be used in so far as they have a flexibility when in the form of a sheet or film. The electroconductive portions 1a of the rectangular connecting piece 1 are formed, preferably, of silicone rubber impregnated with an electroconductive filler such as carbon black and the insulating portions 1b are also formed of a silicone rubber filled with an insulating filler such as finely divided silica filler. The pitch of the black and white stripes of the rectangular piece 1 and the length of the rectangular piece 1 are determined in accordance with the arrangement of the contact terminals on the printed circuit boards or the display units to be connected with the interconnector.

The thickness of the rectangular connecting piece 1 is not limitative although it is desirable that the rectangular piece 1 exhibits elastic resilience of suitable strength when it is bent. For example, the thickness may be in the range from about 0.15 mm to about 3 mm when the connecting piece 1 is made of a silicone rubber while a smaller thickness, say, down to 0.02 mm or even smaller may be sufficient when the connecting piece 1 is made of a more rigid material such as a polyimide resin or a polyester resin.

As is shown in FIG. 2, the rectangular connecting piece 1 is sandwiched and held between two holder members 2 and 3 firmly. The holder members 2 and 3 are made of an insulating material which is not limited to a particular material but may be plastic resins, rubbery elastomers, glasses, ceramics and the like according to need. The rectangular connecting piece 1 and the holder members 2 and 3 are bonded together either by use of an adhesive agent or by a suitable mechanical means. It is essential that the rectangular connecting piece 1 is extended out of the surfaces of the holder members 2 and 3 in the peripheral portions along the edge lines perpendicular to the direction of the anisotropical electroconductivity of the rectangular connecting piece 1. Furthermore, the angles $\alpha_1$ and $\alpha_2$ shown in FIG. 2 formed between the rectangular connecting piece 1 and the surfaces of the holder members 2 and 3 each should be in the range from 10° to 80° or, preferably, from 20° to 70° and the height $h_1$ and $h_2$ shown in FIG. 2 each should be as large as not smaller than the thickness of the rectangular connecting piece 1. The significance of these limitations will be clear from the description below of the manner in which the interconnector is mounted between two printed circuit boards or between a printed circuit board and a display unit.

FIG. 3 illustrates the inventive interconnector mounted as sandwiched between two printed circuit boards 4 and 5 having rows of contact terminals 6 and 7, respectively in contact with the extended portions of the rectangular connecting piece 1 with a pressure. The extended portions of the rectangular piece 1 are bent as shown in this figure exerting elastic resilience to the contact terminals 6 and 7 so as that the reliability in the electric connection between the interconnector and the contact terminals 6 and 7 of the printed circuit boards 4 and 5 greatly improved.

When the angle $\alpha_1$ or $\alpha_2$ is larger than 80°, that is, the rectangular connecting piece 1 is extended out of the surface of the holder member 2 or 3 almost perpendicularly, bending of the extended portion of the rectangular connecting piece 1 is sometimes not in the desired direction but may be in the wrong direction when the extended portion is pressed downwardly with printed circuit boards 4 and 5 in the actual mounting procedure. On the other hand, when the angle $\alpha_1$ or $\alpha_2$ is smaller than 10°, that is, the rectangular connecting piece 1 is extended out of the surface of the holder member 2 or 3 almost in a parallel direction to the surface, sufficient elastic resilience is never obtained between the rectangular piece 1 and the contact terminals 6 or 7 of the printed circuit boards 4 or 5 so that the reliability in the electric connection is reduced.

Similarly, the limitation in the height $h_1$ as given above is also of significance in order to ensure the bendability of the rectangular connecting piece 1 to produce an adequate elastic resilience to the contact terminals 6 or 7. If the height is smaller than the thickness of the rectangular piece 1, the rectangular piece can be bent no longer in such a manner as illustrated in FIG. 3 so that the expected elastic resilience is not obtained.

A variety of modifications are possible with respect to the cross sections of the holder members 2 and 3 in addition to the simplest embodiment shown in FIGS. 1 to 3, in which the holder members 2 and 3 each have a trapezoidal cross section so that the rectangular connecting piece 1 is held between them without any deformation. In a further preferred embodiment shown in FIGS. 4 and 5 showing the perspective view as disassembled and the cross sectional view, respectively, one of the holder members 2 has a concaved surface or a surface with a groove 2a where it is in contact with the rectangular connecting piece 1 and the other holder member 3 has a convexed surface or surface with a bulge 3a which is, preferably, just to fit the groove 2a of the holder member 2 so as that the rectangular connecting piece 1 is held between them as deformed to have an arch-wise curved cross section. This configuration of the holder members 2 and 3 and the rectangular connecting piece 1 is especially recommended owing to the easiness in positioning the holder members 2 and 3 relative to each other in assembling the interconnector.

Several modifications are also possible within the above described groove-and-bulge configuration in the cross sections of the holder members 2 and 3 as shown in FIGS. 6 to 9. These modifications are equally preferably in respect of the exactness of relative positioning of the holder members 2 and 3 and may be chosen according to need. Furthermore, it is optional to have both wing portions 2d, 2d of a holder member 2 in the embodiment shown in FIGS. 4 and 5 are raised as is illustrated in FIG. 10 showing a perspective view where the rectangular connecting piece is removed for clarity so as that the exact positioning of the holder member 3 relative to the holder member 2 is further facilitated also in the longitudinal direction of the rectangular connecting piece.

The positioning of the connecting piece 1 relative to the holder members 2 and 3 is also facilitated by providing punched holes or notches in the connecting piece 1 and correspondingly providing protrusions on the sur-

INTERCONNECTORS

BACKGROUND OF THE INVENTION

The present invention relates to an interconnector of a novel structure or, more particularly, to a so-called press-contact type interconnector which can be of a relatively large size and suitable for electrically connecting a couple of relatively large printed circuit boards each with a plurality of contact terminals or electrically connecting a relatively large display unit and a printed circuit board with a driving circuit for the display unit built therein to be used as sandwiched between these printed circuit boards or between the display unit and the printed circuit board with an appropriate contacting pressure.

There have been known several types of the interconnectors used as described above. For example, an interconnector is formed by providing ring-wise electroconductive portions around a cylindrical body of an insulating material at a regular pitch (see, for example, Japanese KOKAI No. 50112785) and another is ribbon-like sheet or film formed by assembling electroconductive layers and insulating layers alternately into integrity (see, for example, Japanese KOKAI No. 50-94495). Further, variations of interconnectors are known in which a plurality of electroconductive members are provided on the lateral surface of an insulating member at regular intervals (see, for example, Japanese KOKAI No. 51142689) or filaments of an electroconductive material penetrate a sheet of an insulating material in the direction of the thickness (see, for example Japanese KOKAI No. 52-65892).

A problem in the above described prior art interconnectors is that, in order to obtain very reliable electric connection therewith, a large compressive load is required per unit length or unit area thereof so that the structure for holding the interconnector must be so strong as to be able to withstand the large compressive force between the interconnector and the units to be electrically connected therewith. This problem is more and more difficult as the number of the contact terminals increases or as the size of the contact terminals grows. Furthermore, the condition of contacting cannot be well balanced in the actual mounting when the units to be connected have relatively large dimensions and, consequently, the structure for holding the interconnector is necessarily large and complicated to such an extent that the size of the units to be connected is undesirably limited.

On the other hand, an attempt has been made for decreasing the compressive load in the interconnectors of the type in which a plurality of conductive members are provided on the lateral surface of a belt-like insulating material by having a smaller width of the conductive members being contacted with the units to be connected. This attempt is unsuccessful because of the inconvenience in handling, especially, when the length of the interconnector is large.

Furthermore, an interconnector is known in which a plurality of conductive layers are provided around a hollow tube of a flexible and insulating material at a regular pitch (see, for example, Japanese Utility Model Kokai No. 53-11571), with which the compressive load can be considerably decreased. The interconnectors of this type are defective because their contacting surface is uneven due to the buckling of the hollow tube when in contact under pressure with the units to be connected. This leads to decreased connection reliability.

SUMMARY OF THE INVENTION

An object of the present invention is therefore to provide a novel and improved interconnector of the press-contact type free from the above described problems and disadvantages in the prior art interconnectors even when the size of the interconnector is relatively large.

Thus, the interconnector of the invention is formed by comprising (a) a rectangular connecting piece made of a film or sheet made of an elastic material having anisotropical electroconductivity in the direction substantially parallel to one edge line thereof, and (b) a couple of holder members made of an electrically insulating material holding said rectangular connecting piece having anisotropical electroconductivity as sandwiched therebetween in such a manner that the two opposite peripheral portions of said rectangular connecting piece along the edge lines perpendicular to the direction of the anisotropical electroconductivity are each extended out of the surfaces of the holder members in the direction forming an angle between 10° C. and 80° C. with said surface of the holder member by a height at least equal to the thickness of said rectangular connecting piece.

BRIEF DESCRIPTION OF THE DRAWING

FIG. 1 is a perspective view of an inventive interconnector.

FIG. 2 is a cross sectional view of the interconnector shown in FIG. 1 as cut perpendicularly to the longitudinal direction of the rectangular connecting piece.

FIG. 3 is a cross sectional view showing the manner in which the interconnector of FIG. 1 or FIG. 2 is mounted between two printed circuit boards.

FIG. 4 is a perspective view of another embodiment of the inventive interconnectors as disassembled into the rectangular connecting piece 1 and the holder members 2 and 3.

FIG. 5 is a cross sectional view of the interconnector shown in FIG. 4 as assembled.

FIGS. 6 to 9 are cross sectional views of further different embodiments of the inventive interconnectors.

FIG. 10 is a perspective view of the disassembled holder members of an inventive interconnector, one of the holder members having raised portions at both wings for positioning.

FIGS. 11 to 13 are cross sectional view of an inventive interconnector with holder members of different heights as mounted in three different ways for connecting two printed circuit boards.

DETAILED DESCRIPTION OF THE PREFERRED EMBODIMENTS

Figure 12:
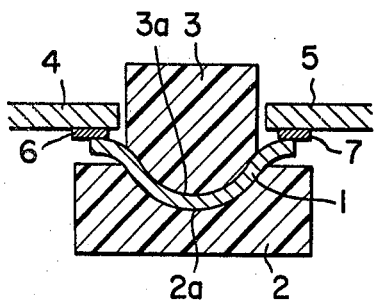

The interconnectors of the present invention are now described in further detail with reference to the drawing illustrating several variations of the interconnectors within the scope of the invention.

In FIG. 1 and FIG. 2 which illustrate a perspective view and a cross sectional view of a simplest embodiment of the inventive interconnectors, respectively, the rectangular connecting piece 1 is made of a sheet or film of an elastic material. This sheet or film is made of an face of one or both of the holder members 2 and 3 so as that the insertion of the protrusions into the holes or notches can give an exact positioning of the connecting piece 1 relative to the holder member 2 or 3.

Figure 13:
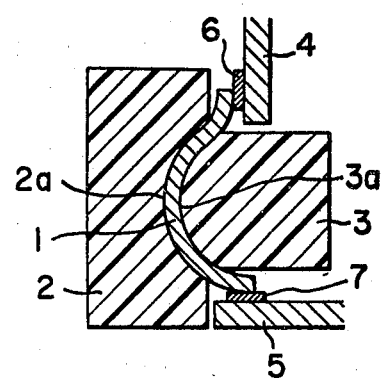

In contrast to the embodiments illustrated in FIGS. 1 to 10 in which both of the holder members 2 and 3 have the equal thickness or height to each other, it is, of course, optional to have the holder members 2 and 3 different in the thickness or height from each other as is shown in FIG. 11, in which the holder member 2 has a larger height than the holder member 3. This type of configuration is recommendable because the raised surfaces 2b, 2b of the holder member 2 can serve as stoppers for the printed circuit boards 4 and 5 so that the mounting procedure of the printed circuit boards 4 and 5 by use of the interconnector is facilitated. This type of the interconnector can be used in three ways. The first is for the parallel mounting of two printed circuit boards 4 and 5 as shown in FIG. 11, the second is for the coplanar mounting of two printed circuit boards 4 and 5 as shown in FIG. 12 and the third is for the perpendicular mounting as shown in FIG. 13 where two printed circuit boards 4 and 5 are positioned perpendicularly to each other.

Figure 14:
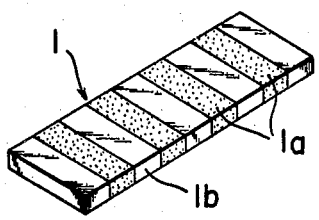
FIGS. 14 to 16 are perspective views showing different types of the rectangular connecting peices.
Figure 15:
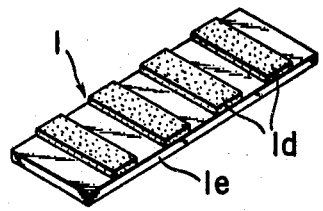

The rectangular connecting piece 1 is also prepared in various way, of which one is the already described type of black-and-white stripes as is shown by the perspective view in FIG. 14 with conductive portions 1a and insulating portions 1b. A modification of this model is shown in FIG. 15, in which the rectangular connecting piece 1 is formed by printing stripes 1d with an electroconductive paint or with pieces of a metal foil on a piece of insulating plastics 1e.

Figure 16:
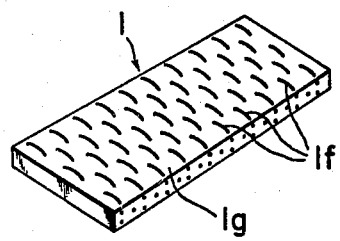

Another type of the rectangular connecting piece 1 is a woven cloth or a net of fine mesh as is shown in FIG. 16, in which the woof 1f is formed with a conductive fiber or filament such as carbon yarns or metal wires while the warp 1g is formed with an insulating fiber of filament such as ordinary synthetic fibers or plastic cords so that the electroconductivity is obtained only in the direction of the woof 1f.

A further alternative of the rectangular connecting piece 1 is prepared by dispersing a conductive fibrous material such as carbon fibers in a unidirectional orientation as embedded uniformly within a matrix of an insulating material such as a silicone rubber and slicing the composite into a sheet in a plane parallel to the orientation of the conductive fibrous material. In a sheet of such a composite material, the electric conductivity is obtained only in the direction of the orientation of the conductive fibrous material and good insulation is ensured in the direction perpendicular to the oriented conductive fibrous material. It is important that the peripheral surface 1c of the rectangular piece 1 should be made in the form as shown in FIG. 7 so as that the contacting of the rectangular connecting piece 1 and the contact terminals 6 or 7 of the printed circuit boards 4 or 5 is always obtained at the section 1c of the piece 1 where the ends of the conductive fibrous material appear. Thus, the configuration of the peripheries 1c as shown in FIG. 6 is undesirable because, in such a configuration, contacting of the piece 1 and the contact terminals 6 or 7 of the printed circuit board 4 or 5 is at the plane of the piece 1 where no conducting fibers may appear so that reliable connection cannot be obtained between the rectangular connecting piece 1 and the printed circuit board 4 or 5.

As is understood from the above description, the advantages obtained with the inventive interconnectors are very great because uniform and reliable electric connection can always be obtained between the contact terminals with a relatively small contacting pressure even when the interconnector is of a relatively large size to be used for connecting relatively large printed circuit boards or display units without the necessity of large and complicated supporting means as in the use of conventional interconnectors of a relatively large size.

What is claimed is:

1. An interconnector comprising
    (a) a rectangular connecting piece of a film or sheet made of an elastic material having anisotropical electro-conductivity in the direction parallel to one edge line thereof, and formed from alternating sandwiched stripes of conductive and nonconductive elastomer, and
    (b) a couple of holder members made of an electrically insulating material holding said rectangular connecting piece of an elastic material having anisotropical electro-conductivity as sandwiched therebetween in such a manner that the two opposite peripheral portions of said rectangular connecting piece at the edge lines perpendicular to the direction of the anisotropical electroconductivity are each extended out of the surfaces of the holder members in the direction forming an angle between 10° and 80° with said surface of the holder member by a height at least equal to the thickness of said rectangular connecting piece.

2. The interconnector as claimed in claim 1 wherein one of the holder members has a concaved groove on the surface where the member is in contact with the rectangular connecting piece extending in the longitudinal direction of the rectangular connecting piece and the other of the holder members has a bulge on the surface where the member is in contact with the rectangular connecting piece to fit the concaved groove in the first member.

* * * * *